(12) United States Patent
Morimoto

(10) Patent No.: US 8,395,255 B2
(45) Date of Patent: Mar. 12, 2013

(54) SEMICONDUCTOR DEVICE HAVING A COOLING FUNCTION COMPONENT

(75) Inventor: Rui Morimoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 44 days.

(21) Appl. No.: 12/984,996

(22) Filed: Jan. 5, 2011

(65) Prior Publication Data

US 2011/0169098 A1 Jul. 14, 2011

(30) Foreign Application Priority Data

Jan. 13, 2010 (JP) ................................. 2010-004991

(51) Int. Cl.
*H01L 23/34* (2006.01)
(52) U.S. Cl. ........ 257/712; 257/276; 257/369; 257/675; 257/713; 257/E21.632; 257/E23.051; 257/E23.08; 257/E23.088; 257/E27.062; 257/E31.131; 257/E33.075

(58) Field of Classification Search .................. 257/276, 257/369, 712, 713, E21.632, E27.062, E23.051, 257/E31.131, E33.075, E23.08, E23.088, 257/675
See application file for complete search history.

(56) References Cited

U.S. PATENT DOCUMENTS

2004/0262745 A1* 12/2004 Cordes et al. ................. 257/713
2008/0157141 A1* 7/2008 Han .............................. 257/292

FOREIGN PATENT DOCUMENTS

| JP | 2000-307042 | 11/2000 |
| JP | 2001-156228 | 6/2001 |
| JP | 2008-166725 | 7/2008 |

* cited by examiner

*Primary Examiner* — Matthew E Warren
*Assistant Examiner* — David Chen
(74) *Attorney, Agent, or Firm* — SNR Denton US LLP

(57) ABSTRACT

A semiconductor device includes: a cooling function component including an active region made of an impurity region and formed on a surface of a semiconductor layer, an N-type gate made of a semiconductor including an N-type impurity, a P-type gate made of a semiconductor including a P-type impurity, a first metal wiring connected to the N-type gate, the P-type gate and the active region, a second metal wiring connected to the P-type gate and the N-type gate, and a heat releasing portion connected to the second metal wiring for releasing heat to the outside.

9 Claims, 7 Drawing Sheets

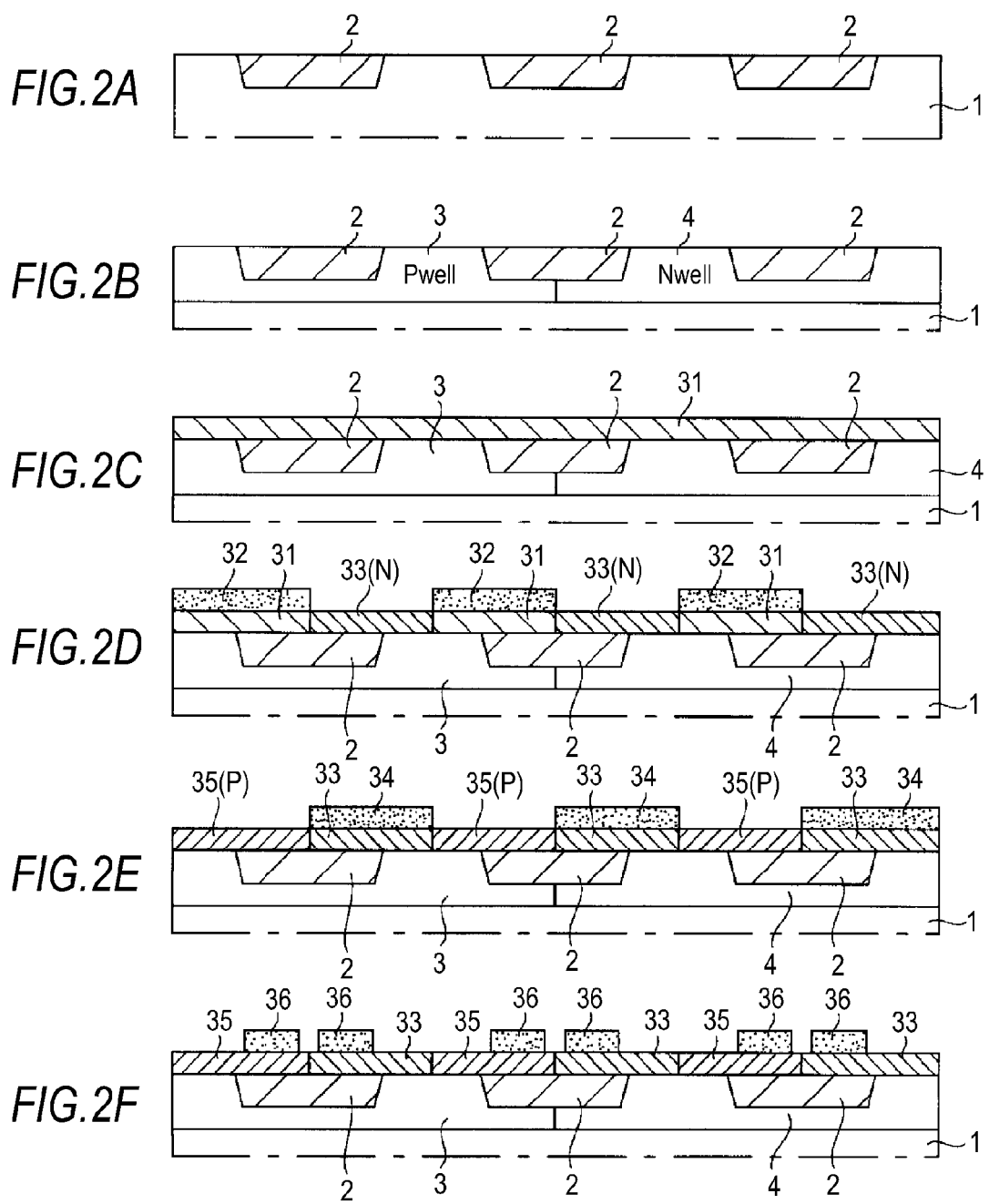

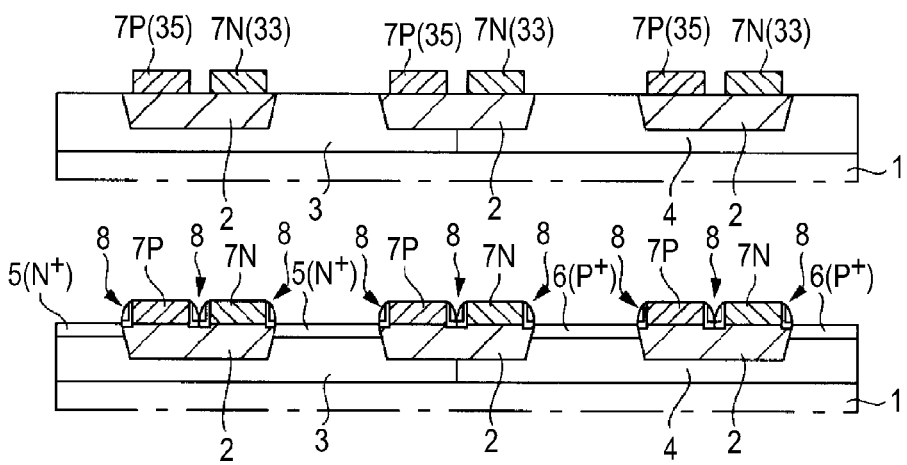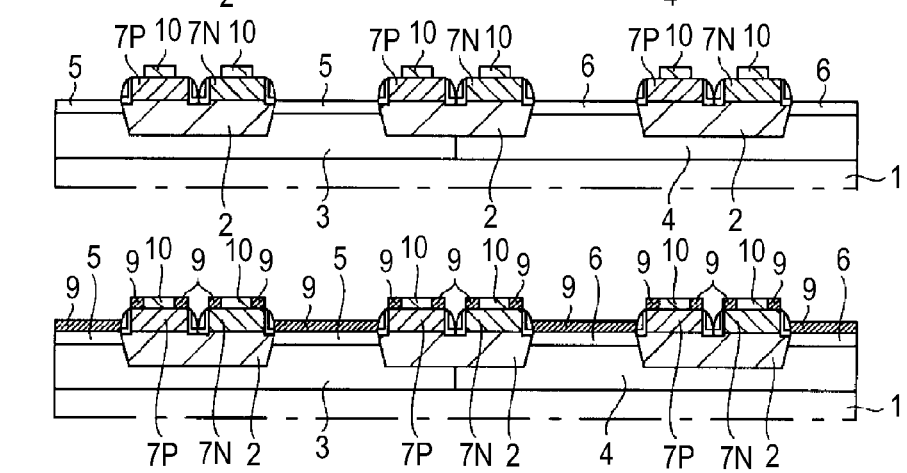

SEMICONDUCTOR DEVICE HAVING A COOLING FUNCTION COMPONENT

BACKGROUND OF THE INVENTION

1. Field of the Invention

The present invention relates to a semiconductor device having an active component such as a transistor and a manufacturing method thereof.

2. Description of the Related Art

Along with the development of CMOS technology in recent years, drive capability of a transistor is increased and heat generated from the transistor has problems.

In a MOS transistor, a threshold voltage Vth is reduced by 2 mV when temperature is increased by 1° C., therefore, sub-threshold current is increased by two digits in a state of 125° C. as compared with a state of room temperature. Accordingly, temperature management is highly important in the semiconductor device.

In a high-speed logic device such as a CPU, a chip has been hitherto cooled by mounting a heat sink, a fan and so on (for example, refer to JP-A-2000-307042 (Patent Document 1).

The above method is a method of cooling the chip from the outside, which may cause increase of stand-by current, TDDB (Time Dependent Dielectric Breakdown), electromigration and the like and may cause significant troubles with respect to device reliability when the heat generation amount is further increased with progress in miniaturization.

On the other hand, in a semiconductor device formed by performing planarization by a CMP (Chemical Mechanical Polishing) method, a dummy is arranged on the surface of a semiconductor substrate because of planarization of an interlayer insulating film (for example, refer to U.S. Pat. No. 7,014,955 (Patent Document 2)).

A layer in which the dummy is arranged is a layer relating to planarization by the CMP method, which is an active region, a gate, a metal dummy and so on. The use of the dummy as an active component has not been hitherto considered.

Accordingly, a structure in which a cooling function component is arranged in a substrate itself on which the semiconductor device is formed has been devised (for example, refer to JP-A-2008-166725 (Patent Document 3)).

However, it is necessary to add a process for forming the cooling function component to the above method, which may not satisfy the admissibility of cost effectiveness.

In response to the above, there is proposed an attempt to fabricate the device having the cooling function component without positively increasing the process by using agate dummy which has not been used as the active component (for example, refer to JP-A-2001-156228 (Patent Document 4)).

SUMMARY OF THE INVENTION

However, there is no description about the detailed structure of a heat absorption portion and a heat generation portion in Patent Document 4, therefore, the invention is insufficient in concreteness and practicability.

It is strongly desirable to provide a semiconductor device with a cooling device as well as a manufacturing method of the semiconductor device with the cooling device, which enables efficient cooling from the substrate surface.

According to embodiments of the invention, there are provided a semiconductor device and a manufacturing method thereof capable of performing effective cooling with respect to heat generation.

The semiconductor device according to one embodiment of the invention includes a cooling function component.

The cooling function component includes an active region made of an impurity region and formed on a surface of a semiconductor layer, an N-type gate made of a semiconductor including an N-type impurity, a P-type gate made of a semiconductor including a P-type impurity. The cooling function component further includes a first metal wiring connected to the N-type gate, the P-type gate and the active region, a second metal wiring connected to the P-type gate and the N-type gate, and a heat releasing portion connected to the second metal wiring for releasing heat to the outside.

The manufacturing method of a semiconductor device according to another embodiment of the invention includes the steps of forming a semiconductor film to be a gate on a semiconductor layer, implanting an N-type impurity into one part of the semiconductor film and implanting a P-type impurity into the other part of the semiconductor film. The method further includes the steps of forming an N-type gate and a P-type gate respectively by patterning the semiconductor film and forming an active region made of an impurity region on the surface of the semiconductor layer. The method also includes the steps of forming a first metal wiring connected to the N-type gate, the P-type gate and the active region and forming a second metal wiring connected to the P-type gate and the N-type gate and forming a heat releasing portion connected to the second metal wiring for releasing heat to the outside.

In the structure of the semiconductor device according to the embodiment of the invention, the cooling function component includes the first metal layer connected to the N-type gate, the P-type gate and the active region and the second metal wiring connected to the P-type gate and the N-type gate. Accordingly, when voltage is supplied so that electric current flows in the order of N-type gate, the first metal wiring, the P-type gate, the second metal wiring and the N-type gate, heat absorption occurs at the first metal wiring and heat generation occurs at the second metal wiring.

As the first metal wiring causing heat absorption is connected to the active region formed on the surface of the semiconductor layer, the heated semiconductor layer can be efficiently cooled.

Additionally, the second metal wiring causing heat generation is connected to the heat releasing portion for releasing heat to the outside, therefore, cooling can be efficiently performed by releasing heat to the outside.

In the manufacturing method of the semiconductor device according to the embodiment of the invention, after implanting N-type and P-type impurities into the semiconductor film respectively, the N-type gate and the P-type gate are formed by patterning the semiconductor film and the active region made of the impurity region is formed on the surface of the semiconductor layer. Then, the first metal wiring connected to the N-type gate, the P-type gate and the active region is formed, the second metal wiring connected to the P-type gate and the N-type gate is formed and the heat releasing portion connected to the second metal wiring for releasing heat to the outside is formed.

Accordingly, the semiconductor device having the above cooling function component according to the embodiment of the invention can be manufactured easily by applying a normal manufacturing method of the semiconductor device which has been hitherto known.

When the semiconductor device according to the embodiment of the invention is applied, the semiconductor layer can be efficiently cooled and heat can be efficiently released to the outside due to the cooling function component, therefore, characteristics of circuit components in the semiconductor device can be stabilized.

Accordingly, the semiconductor device operating which operates stably with high reliability can be realized.

When the manufacturing method of the semiconductor device according to the embodiment of the invention is applied, the semiconductor device having the cooling function component can be manufactured easily by using a normal manufacturing method of the semiconductor device, therefore, the cooling function component can be fabricated so as to response to miniaturization and so on of circuit components.

Accordingly, even when miniaturization of circuit components and increase of drive performance are developed, the semiconductor device can be operated stably by cooling the device sufficiently.

BRIEF DESCRIPTION OF THE DRAWINGS

FIGS. 2A to 2F are manufacturing process drawings showing a manufacturing method of the semiconductor device of FIGS. 1A and 1B;

FIGS. 3G to 3K are manufacturing process drawings showing a manufacturing method of the semiconductor device of FIGS. 1A and 1B;

DESCRIPTION OF THE PREFERRED EMBODIMENTS

Hereinafter, best modes for carrying out the invention (referred to as embodiments in the following description) will be explained.

Figure 1A:
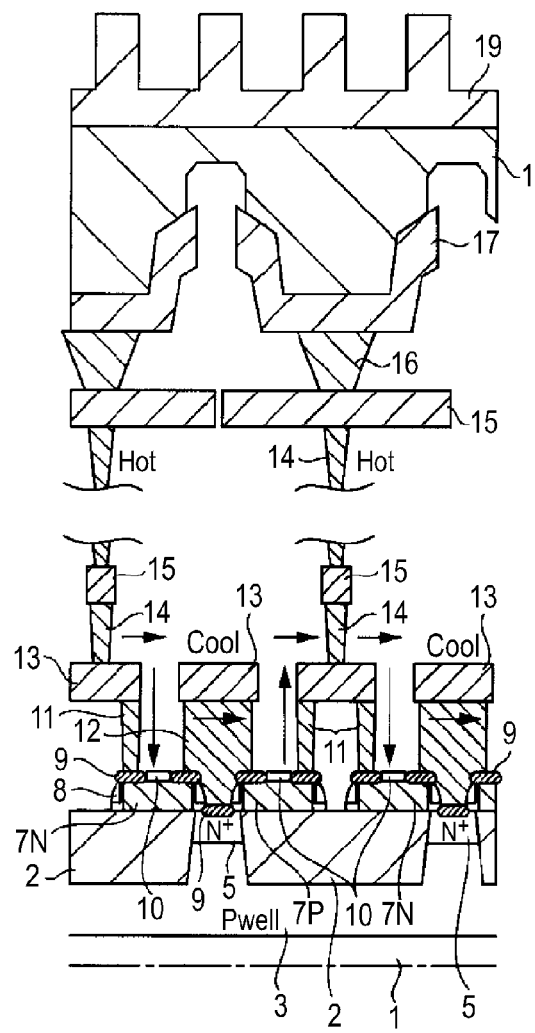
FIGS. 1A and 1B are schematic structural views (cross-sectional views) of a semiconductor device according to a first embodiment of the invention.
Figure 1B:
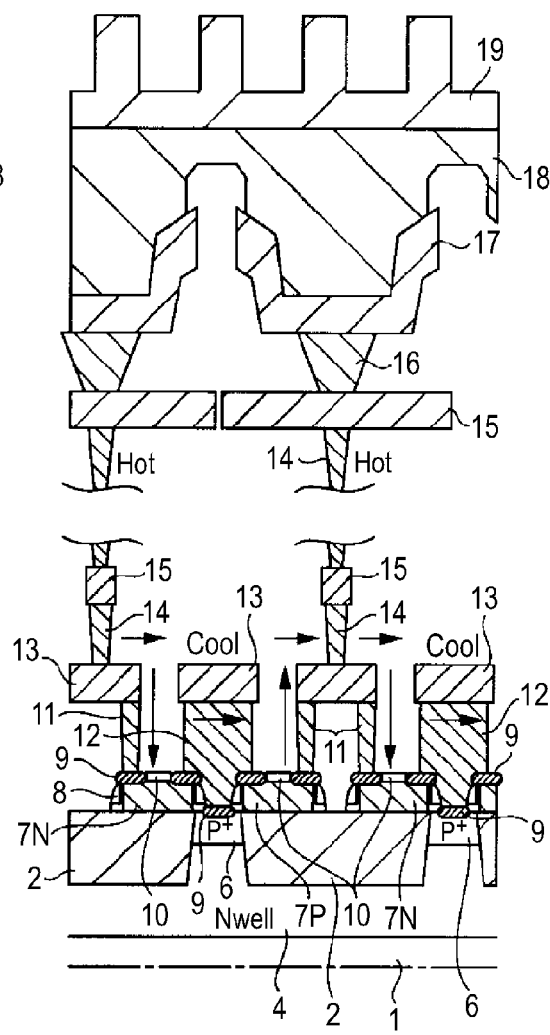

The explanation will be made in the following order.
1. First Embodiment
2. Second Embodiment
3. Third Embodiment
4. Fourth Embodiment
5. Modification Example 1. First Embodiment Schematic structural views (cross-sectional views) of a semiconductor device according to a first embodiment of the invention are shown as FIGS. 1A and 1B. FIG. 1A is a cross-sectional view showing a portion of a P-type semiconductor well region formed on a silicon substrate 1. FIG. 1B is a cross-sectional view showing a portion of an N-type semiconductor device well region formed on the silicon substrate 1. Both FIGS. 1A and 1B show cross-sectional views of portions in which a cooling function component in the semiconductor device according to an embodiment of the invention is formed.

As shown in FIGS. 1A and 1B, a component isolation layer 2 having an STI (shallow trench isolation) structure for isolating components is formed in a P-type semiconductor well region 3 and an N-type semiconductor well 4 which are formed on the silicon substrate 1, respectively. The component isolation layer 2 can be made of, for example, a silicon oxide layer.

An N-type gate dummy 7N and a P-type gate dummy 7P made of a semiconductor such as polysilicon are formed on the component isolation layer 2.

Sidewalls 8 made of an insulating layer are formed at side walls of respective gate dummies 7N, 7P.

The gate dummies 7N, 7P as well as the sidewalls 8 which are side walls thereof are made of the same material as gates of an NMOS transistor and a PMOS transistor as well as sidewalls thereof, which are formed at not-shown portions on the silicon substrate 1.

Though the N-type gate dummy 7N and the P-type gate dummy 7P are made of the same material as the gates of MOS transistors, they are formed on the component isolation layer 2, therefore, they do not operate as gates.

An N+ active region 5 made of an N-type high concentration impurity region is formed on the surface of a portion between the component isolation layers 2 in the p-type semiconductor well region 3. A P+ active region 6 made of a P-type high concentration impurity region is formed on the surface of a portion between the component isolation layers 2 in the N-type semiconductor well region 4.

A silicide 9 made of a metal element such as W, Ti, Ni or Co and silicon is formed on surfaces of these N+ active region 5 and the P+ active region 6 as well as on surfaces of the gate dummies 7N, 7P.

A silicide block 10 made of an insulting layer is formed in the center of the surface of the gate dummies 7N, 7P, and the silicide 9 is formed at portions on the surfaces of the gate dummies 7N, 7P, where the silicide block 10 is not formed.

A first contact layer 11 and a second contact layer 12 are connected to the N-type gate dummy 7N and the P-type gate dummy 7P through the silicide 9.

The first contact layer 11 is formed to be a thin plug shape, which is connected to the silicide 9 of respective gate dummies 7N, 7P.

The second contact layer 12 is formed to be thick as compared with the first contact layer 11, which is connected to the silicide 9 on surfaces of the active regions 5, 6 as well as silicide 9 on surfaces of two gate dummies at right and left of the active regions 5, 6.

The first contact layer 11 and the second contact layer 12 are made of a metal layer which is the same layer as a contact layer electrically connected to a gate and an impurity region included in an active component such as a transistor which is formed at not-shown other portions of the silicon substrate 1.

A first-layer metal wiring layer 13 is formed over the first contract layer 11 and the second contact layer 12. The first-layer metal wiring layer 13 is made of the same layer as a first-layer metal wiring layer which is electrically connected to the component such as the transistor through the contact layer, which is formed at not-shown other portions in the silicon substrate 1.

Additionally, the first-layer metal wiring layer 13 connects two first contact layers 11 which are respectively connected to the N-type gate dummy 7N and the P-type gate dummy 7P adjacent to each other on the same component isolation layer 2.

According to the above, the N-type gate dummy 7N, the second contact layer 12, the P-type gate dummy 7P, the first contact layer 11, the first-layer metal wiring layer 13, the first contact layer 11 and the N-type gate dummy 7N are electrically connected through the silicide 9 in this order. As described above, the N-type gate dummy 7N and the P-type gate dummy 7P are alternately connected in the order of N, P, N, P . . . .

Furthermore, a plug layer 14 and a metal wiring layer 15 formed in via holes are formed in several layers repeatedly in the first-layer metal wiring layer 13 on the first contact layers 11.

On the uppermost layer of the metal wiring layer 15, a pad dummy 17 is formed through a contact layer 16 formed in via holes. The pad dummy 17 is made of the same metal layer as a pad for bonding which is formed at not-shown other portions for connecting to the outside by wire bonding and the like. The pad dummy 17 buries an opening formed in a not-shown insulating layer and further formed over the insulating layer at the outside of the opening.

Additionally, a heatsink 19 is attached over the pad dummy 17 through a heat conduction material 18 having high heat conductivity.

The plug layer 14, the metal wiring layer 15, the contact layer 16, the pad dummy 17, the heat conduction material 18 and the heatsink 19 are thermally connected to the first-layer metal wiring layer 13.

The cooling function component is formed by including respective component such as the N-type and P-type gate dummies 7N, 7P, the active regions 5, 6, the first contact layer 11, the second contact layer 12, the first-layer metal wiring layer 13, the pad dummy 17 and the heat sink 19.

In order to operate the cooling function component of the semiconductor device according to the embodiment, electric current is made to flow in directions shown by arrows in the drawing by supplying voltage from a power source and the like.

When electric current flows in directions shown by arrows, in the second contact layer 12 in which electric current flows from the N-type gate dummy 7N to the P-type gate dummy 7P along the flow of electric current, heat absorption occurs due to Peltier effect.

On the other hand, in the metal wiring in which electric current flows from the P-type gate dummy 7P to the N-type gate dummy 7N, that is, in the first contact layer 11 and the first-layer metal wiring layer 13 formed thereon, heat generation occurs.

It is desirable to absorb heat generated in the silicon substrate 1 and to release absorbed heat to the outside because most of generated heat in an LSI is generated from active components on the silicon substrate such as transistors having high resistance.

The second contact layer 12 connecting the N-type gate dummy 7N to the P-type gate dummy 7P is connected to the active regions 5, 6 on the semiconductor well regions 3, 4 of the silicon substrate 1 through the silicide 9.

According to the above, heat of the silicon substrate 1 can be absorbed through the silicide 9 having good heat conductivity, which can cool the silicon substrate 1 effectively.

On the other hand, the first contact layer 11 and the first-layer metal wiring layer 13 formed thereon, which connect the P-type gate dummy 7P to the N-type gate dummy 7N are pulled up to the pad dummy 17 by a stack structure including the plug layer 14 and the metal wiring layer 15 made of the metal material having high heat conductivity.

Additionally, the heatsink 19 is attached over the pad dummy 17 through the heat conduction material 18 having high heat conductivity, therefore, heat can be released from the heatsink 19.

The semiconductor device including the cooling function component shown in FIGS. 1A and 1B can be manufactured, for example, in a manner described as follows.

FIG. 2A to FIG. 4N are referred to as manufacturing process drawings. In these manufacturing process drawings, the size and shape of respective components of the semiconductor device are partially different from FIGS. 1A and 1B for convenience of drawings.

First, the component isolation layer 2 having the STI structure is formed on the silicon substrate 1 in the same manner as a normal manufacturing process of the LSI as shown in FIG. 2A.

Next, as shown in FIG. 2B, the P-type semiconductor well region 3 is formed on the silicon substrate 1 by implanting a P-type impurity as well as the N-type semiconductor well region 4 is formed by implanting an N-type impurity. It does not matter which semiconductor well region is formed first.

Next, as shown in FIG. 2C, a polysilicon film 31 as a material for the gate is formed on the silicon substrate 1 by a CVD (Chemical Vapor Deposition) and so on.

Next, a mask made of a photoregist 32 is formed on the polysilicon film 31. The pattern of the photoresist 32 is formed so as to cover at least portions to be the P-type gate dummy 7P and the P-type gate of the transistor as well as so as not to cover portions to be the N-type gate dummy and the N-type gate of the transistor.

As shown in FIG. 2D, portions not covered with the photoresist 32 in the polysilicon film 31 are made to be N-type doped polysilicons 33 by ion-implantation of the N-type impurity to the polysilicon film 31 by using the photoresist 32 as a mask.

After that, the photoresist 32 is removed.

Next, a mask made of a photoresist 34 is formed on the poly silicon film 31. The pattern of the photoresist 34 is formed so as to cover at least portions to be the N-type gate dummy 7N and the N-type gate of the transistor as well as so as not to cover portions to be the P-type gate dummy 7P and the P-type gate of the transistor. The shown portion has a pattern reverse to the photoresist 32 of FIG. 2D as shown in FIG. 2E.

Then, portions not covered with the photoresist 34 in the polysilicon film 31 are made to be P-type doped polysilicons by ion-implantation of the P-type impurity to the polysilicon film 31 by using the photoresist 34 as a mask.

After that, the photoresist 34 is removed.

Next, as shown in FIG. 2F, a mask made of a photoresist 36 is formed on the N-type doped polysilicons 33 and the P-type doped polysilicons 35 in a pattern corresponding to the gate dummies 7N, 7P and gates of transistors.

Additionally, the N-type doped polysilicons 33 and the P-type doped polysilicons 35 are patterned to form the gate dummies 7N, 7P and gates of transistors by using the photoresist 36 as a mask.

After that, the photoresist 36 is removed. The state is shown in FIG. 3G.

After that, self-alignment is performed in the gate dummies 7N, 7P and gates of transistors to form sidewalls 8 made of the insulating layer at side walls of the gate dummies 7N, 7P and gates of transistors as shown in FIG. 3H.

Then, the N+ active region 5 and the P+ active region 6 are sequentially formed on surfaces of the semiconductor well regions 3, 4 of the silicon substrate 1 by ion-implantation as shown in FIG. 3H.

Source/drain regions of transistors are formed at the semiconductor well regions 3, 4 of the silicon substrate 1 by ion implantation, though not shown.

The order of forming the N+ active region 5, the P+ active region 6 and the source/drain region of the transistor does not particularly matter. A combination of the N+ active region 5 and the N-type source/drain region as well as a combination of the P+ active region 6 and the P-type source/drain region can be simultaneously formed if there is no problem when they have the same impurity concentration.

After that, the silicide block 10 is formed by using, for example, a silicon nitride film and a silicon oxide film at parts of the surfaces of the gate dummies 7N, 7P by patterning using lithography before forming the silicide 9 as shown in FIG. 3I.

Respective film thicknesses of the silicon nitride film and the silicon oxide film forming the silicide block 10 preferably have thicknesses in which the films sufficiently remain after removal processing of a natural oxide film in the process of forming the silicide 9.

Next, after removing the natural oxide film on the surface of the silicon substrate 1, the silicide 9 is formed on surfaces of the active regions 5, 6 and two portions separated by the silicide block 10 in each of the gate dummies 7N, 7P. For example, after a metal film made of W (tungsten) is deposited, the silicide 9 is formed by using silicon and a metal film by ramp annealing and so on. The forming of the silicide is performed at the same time as the forming process of silicide with respect to not-shown transistors and the like in other portions.

Next, after an insulating layer 37 is formed by covering the whole, openings reaching the silicide 9 on the active regions 5, 6 as well as the silicide 9 on the gate dummies 7N, 7P are formed in the insulating layer 37.

Subsequently, a metal layer is formed so as to bury the openings, then, the metal layer on the insulating layer 37 is removed, thereby forming the first contact layer 11 and the second contact layer 12 in the openings of the insulating film 37 so as to connect to the silicide 9 as shown in FIG. 3K. The second contact layer 12 is connected to the silicide 9 on surfaces of one of the two portions separated by the silicide block 10 on the surface of each of the gate dummies 7N, 7P as well as surfaces of the active regions 5, 6. The first contact layer 11 is connected to the silicide 9 on surfaces of the other of the two portions separated by the silicide block 10 on the surface of each of the gate dummies 7N, 7P. The forming of the first contact layer 11 and the second contact layer 12 are performed at the same time as a process of forming a contact layer with respect to the impurity regions or gates formed in the silicon substrate 1, which compose the transistor at not-shown portions.

In FIG. 3K, the second contact layer 12 connected to the silicide 9 on the N-type gate dummy 7N is separated from the second contact layer 12 connected to the silicide 9 on the P-type gate dummy 7P. These second contact layers 12 are connected to each other at a portion not shown in FIG. 3K, and the second contact layer 12 is formed over the N-type gate dummy 7N and the P-type gate dummy 7P in the same manner as shown in FIGS. 1A and 1B.

Figure 4L:
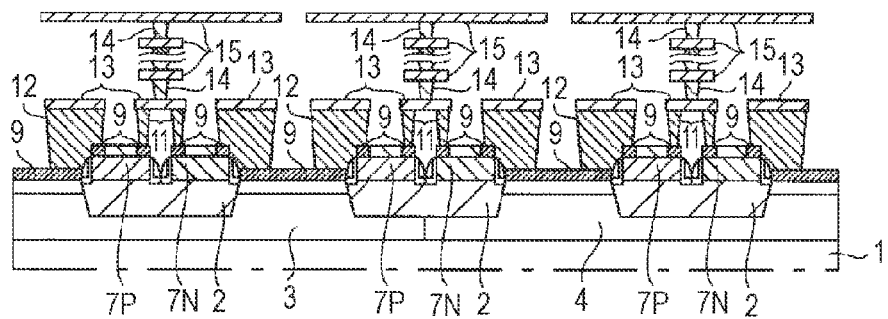
FIGS. 4L to 4N are manufacturing process drawings showing a manufacturing method of the semiconductor device of FIGS. 1A and 1B.

Next, the first-layer metal wiring layer 13 is formed so as to connect to the first contact layer 11 and the second contact layer 12, and further, the necessary number of the plug layers 14 and the metal wiring layers 15 is formed repeatedly thereon. The state obtained by forming the uppermost metal wiring layer 15 is shown in FIG. 4L.

Figure 4M:
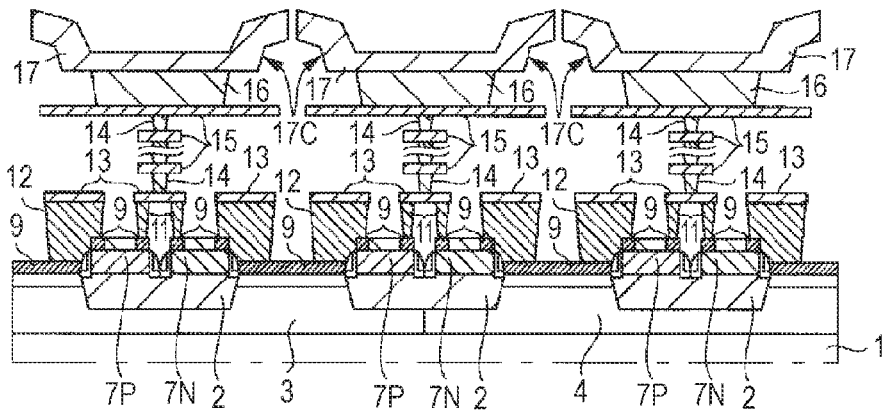

Next, a shown in FIG. 4M, the contact layer 16 and the pad dummy 17 are sequentially formed on the uppermost metal wiring layer 15. The pad dummy 17 is formed simultaneously with bonding pads to be formed at other portions. The pad dummy 17 buries an opening 17C formed in the insulating film, which is formed over the insulating layer at the outside of opening 17C.

Figure 4N:
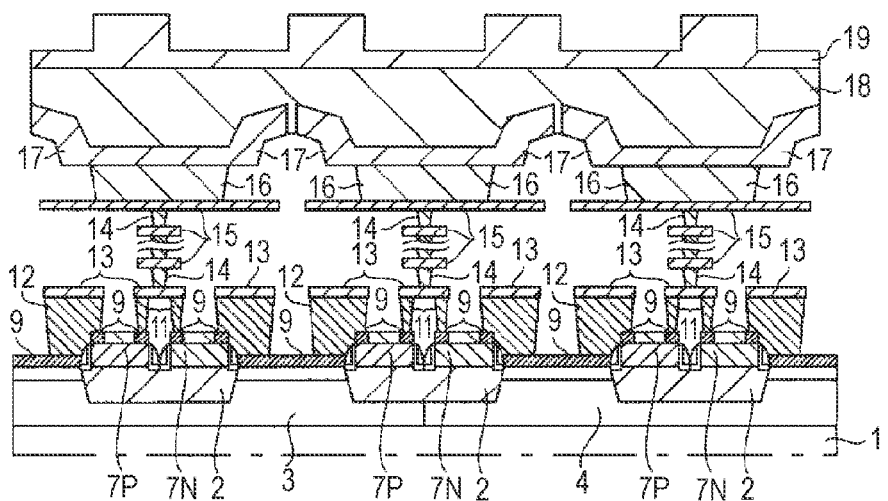

Next, as shown in FIG. 4N, the heat conduction material 18 and the heatsink 19 are sequentially formed over the pad dummy 17.

In the manner as described above, the semiconductor device shown in FIGS. 1A and 1B can be manufactured.

According to the above manufacturing method, the semiconductor device having the cooling function component can be easily manufactured by applying a normal manufacturing method of the semiconductor device.

Consequently, the cooling function component can be manufactured so as to respond to miniaturization and the like of circuit components.

The process of forming components included in the cooling function component is performed at the same time as the process of forming respective components included in the transistor formed on the other portions of the silicon substrate 1, thereby fabricating the transistor and cooling function component without adding processes. As a result, it is possible to manufacture the semiconductor device with the cooling function component at reasonable manufacturing costs.

According to the structure of the above embodiment, the second contact layer 12 is connected to the N-type gate dummy 7N, the P-type gate dummy 7P and the active regions 5, 6 through the silicide 9. The first contact layer 11 is connected to the P-type gate dummy 7P and the N-type gate dummy 7N respectively through the silicide 9, and the first-layer metal wiring layer 13 is formed so as to connect to two first contact layers 11.

According to the above structure, when electric current is made to flow through the N-type gate dummy 7N, the second contact layer 12, the P-type gate dummy 7P, the first contact layer 11, the first-layer metal wiring layer 13, the first contact layer 11, the N-type gate dummy 7N in this order, heat absorption occurs in the second contact layer 12. At the same time, heat generation occurs in the first contact layer 11 and the first-layer metal wiring layer 13 formed thereon.

Then, the second contact layer 12 in which the heat absorption occurs is connected to the active regions 5, 6 on the surfaces of the silicon substrate 1, therefore, the heated silicon substrate 1 can be efficiently cooled.

Additionally, the pad dummy 17, the heat conduction material 18 and the heat sink 19 are provided on the first-layer metal wiring layer 13 in which heat generation occurs, which are thermally connected thereto as a heat releasing portion for releasing heat to the outside. According to the structure, it is possible to release heat to the outside from the heatsink 19 to thereby efficiently cool the substrate.

According to the structure of the embodiment, the silicon substrate 1 can be efficiently cooled by the cooling function component to release heat to the outside efficiently, therefore, it is possible to cool the semiconductor device and to stabilize characteristics of circuit components (transistor and so on) in the semiconductor device.

For example, stabilization of threshold voltage in transistors, reduction of stand-by leakage, reduction of variation in operation timing due to stabilization of characteristics and so on can be realized. Additionally, improvement of the characteristic yield as well as reduction of manufacturing costs can be also realized.

In the embodiment of the invention, various types of arrangements can be considered in a combination between the active components which generate heat such as the transistor and the cooling function component according to the structure of the embodiment of the invention such as the gate dummy and the dummy pad.

Here, the several number of specific forms in planar arrangement of the active component and the cooling function component will be shown as follows as the semiconductor devices according to other embodiments of the invention.

2. Second Embodiment

Figure 5:
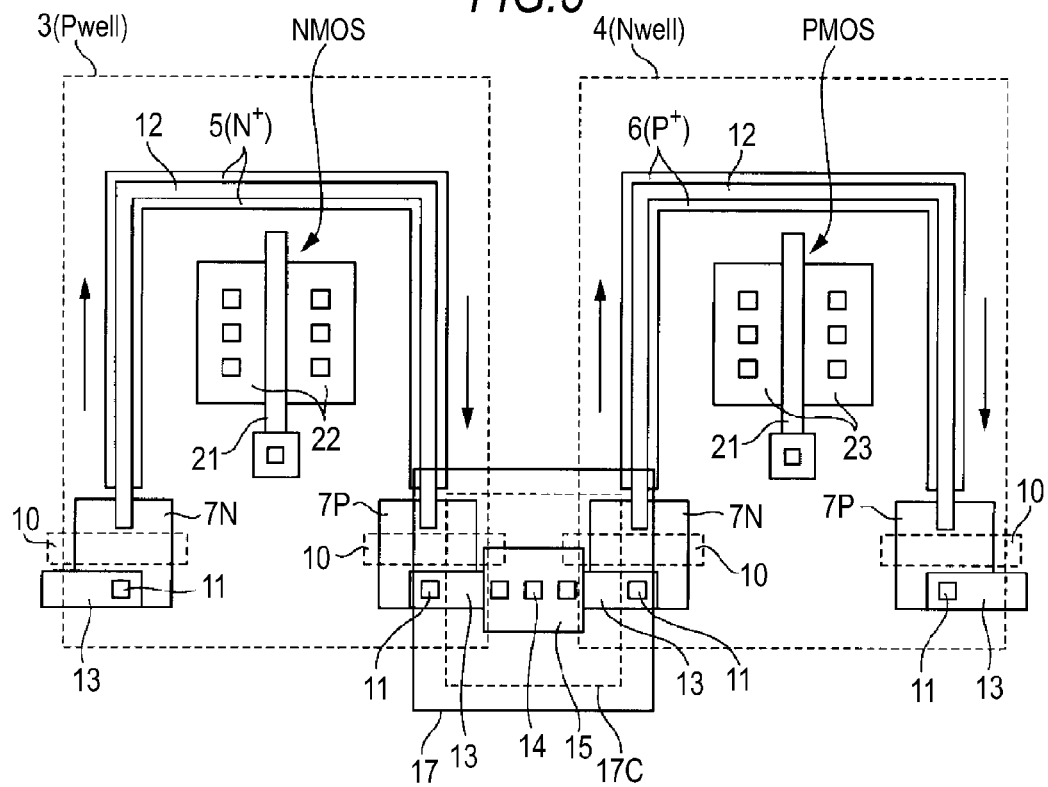
FIG. 5 is a schematic plan view of a semiconductor device according to a second embodiment of the invention.

A schematic plan view of a semiconductor device according to a second embodiment of the invention is shown in FIG. 5.

The embodiment relates to a case in which the cooling function component having the same current path is provided at the active component on the N-type semiconductor well region and the active component on the P-type semiconductor well region.

As shown in FIG. 5, an N-type MOS transistor NMOS including a gate 21 and an N-type source/drain region 22 is formed in the P-type semiconductor well region 3 as the active component.

Also, a P-type MOS transistor PMOS including the gate 21 and an P-type source/drain region 23 is formed in the N-type semiconductor well region 4 as the active component.

It is generally known that heat is generated chiefly from these transistors NMOS, PMOS.

In the P-type semiconductor well region 3 in the left side of the drawing, the second contact layer 12 connected to the N+ active region 5 is formed so as to surround right and left as well as the back of the N-type MOS transistor NMOS. The N-type gate dummy 7N is formed at a left-near part of the P-type semiconductor well region 3 and the P-type gate dummy 7P is formed at a right-near part thereof.

In the N-type semiconductor well region 4 in the right side of the drawing, the second contact layer 12 connected to the P+ active region 6 is formed so as to surround right and left as well as the back of the P-type MOS transistor PMOS. The N-type gate dummy 7N is formed at a left-near part of the N-type semiconductor well region 4 and the P-type gate dummy 7P is formed at a right-near part thereof.

The planer pattern of the gate dummies 7N, 7P and the planar pattern of the active regions 5, 6 are arranged at some distance. This is for preventing impurities from entering the gate dummies 7P, 7N having opposite conduction types at the time of forming the active regions 5, 6. Additionally, they are arranged at some distance in the same manner even in the case of the same conductive type to thereby facilitate the formation by making the layout symmetrical.

The silicide block 10 is formed on the gate dummies 7N, 7P in an elongated shape in right and left directions. On portions in which the silicide block 10 is not formed in surfaces of the gate dummies 7N, 7P, not shown silicide is formed.

The first-layer metal wiring layer 13 is connected to the P-type gate dummy 7P in the P-type semiconductor well region 3 and the N-type gate dummy 7N in the N-type semiconductor well region 4 through the first contact layer 11. The plug layer 14 is formed on the center of the first-layer metal wiring layer 13 and the metal wiring layer 15 is formed thereon.

The dummy pad 17 is formed further thereon. The opening 17C for the dummy pad 17 which is the same as shown in FIG. 4M is shown by a dashed line in the drawing.

The first contact layer 11 and the second contact layer 12 are connected to different regions separated by the silicide block 10 in each of the gate dummies 7N, 7P.

According to the structure, electric current flows through the gate dummies 7N, 7P without short-circuit between the first contact layer 11 and the second contact layer 12 due to the silicide.

In the semiconductor device according to the embodiment, two N-type gate dummies 7N and two P-type gate dummies 7P are electrically connected alternately.

In the semiconductor device according to the embodiment, a path in which electric current flows is shown by arrows in the drawing.

Electric current is made to flow, from the N-type dummy 7N, through the second contact layer 12 and the active regions 5, 6, then, into the P-type gate dummy 7P, the first contact layer 11, the first-layer metal wiring layer 13, the first contact layer 11 and the N-type gate dummy 7N in the right-adjacent well region in this order.

According to the structure, similarly to the first embodiment, heat absorption occurs in the active regions 5, 6 and the second contact layer 12, and heat generation occurs in the first contact layer 11 and the first-layer metal wiring layer 13 formed thereon.

The active regions 5, 6 and the second contact layer 12 in which the heat absorption occurs are formed in the same semiconductor well regions 3, 4 as the transistors NMOS, PMOS as respective cooling objects. The source/drain regions 22, 23 of the transistors NMOS, PMOS have conduction types opposite to the semiconductor well regions 3, 4. According to the structure, junction leakage does not occur in the active regions 5, 6 and the source/drain regions 22, 23.

Additionally, the active regions 5, 6 and the second contact layer 12 in which the heat absorption occurs are arranged in the vicinity of the transistors NMOS, PMOS, therefore, heat from the transistors NMOS, PMOS is absorbed efficiently.

The pad dummy 17 connected to the metal wiring causing heat generation is formed over the sufficiently wide area as compared with the gate dummies 7N, 7P and the metal wiring layer 15. According to this, heat can be efficiently released.

According to the structure of the above embodiment, the second contact layer 12 is connected to the N-type gate dummy 7N, the P-type gate dummy 7P and the active regions 5, 6 in the same manner as the above first embodiment. The first contact layer 11 is connected to the P-type gate dummy 7P and the N-type gate dummy 7N respectively, and the first-layer wiring layer 13 is formed so as to connect to the two first contact layers 11.

According to the above structure, when electric current is made to flow through the N-type gate dummy 7N, the second contact layer 12, the P-type gate dummy 7P, the first contact layer 11, the first-layer metal wiring layer 13, the first contact layer 11 and the N-type gate dummy 7N in this order, heat absorption occurs in the second contact layer 12. At the same time, heat generation occurs in the first contact layer 11 and the first-layer metal wiring layer 13 formed thereon.

The second contact layer 12 in which heat absorption occurs is connected to the active regions 5, 6 on surfaces of the silicon substrate, therefore, the heated silicon substrate can be sufficiently cooled.

Additionally, the pad dummy 17 and so on to be the heat releasing portion for releasing heat to the outside are formed over the first-layer metal wiring layer 13 in which heat generation occurs, therefore, heat is released from the heatsink 19 and cooling can be efficiently performed.

Further according to the structure of the embodiment, the silicon substrate is sufficiently cooled and heat can be efficiently released to the outside due to the cooling function component, therefore, it is possible to cool the semiconductor device and to stabilize characteristics of circuit components (transistors and so on) in the semiconductor device.

For example, stabilization of threshold voltage in the transistor, reduction of stand-by leakage, reduction of variation in operation timing due to stabilization of characteristics and so on can be realized. Additionally, improvement of the characteristic yield as well as reduction of manufacturing costs can be realized.

3. Third Embodiment

Figure 6:
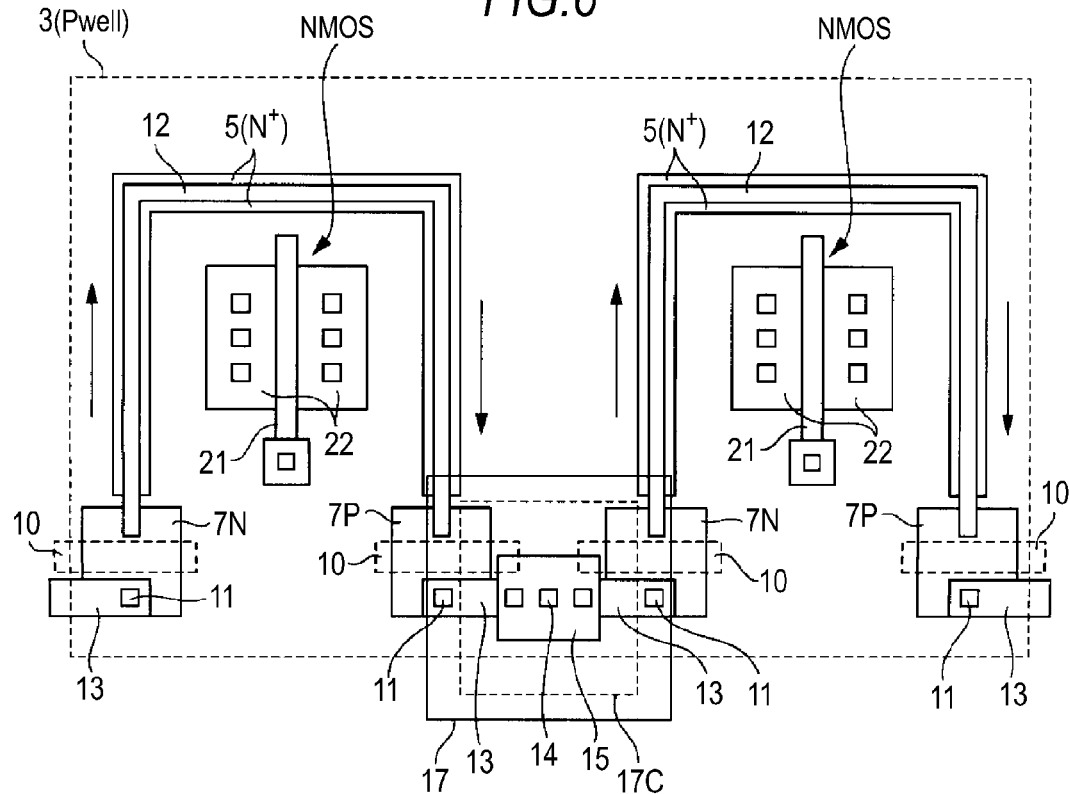
FIG. 6 is a schematic plan view of a semiconductor device according to a third embodiment of the invention.

A schematic plan view of a semiconductor device according to a third embodiment of the invention is shown in FIG. 6.

The embodiment relates to a case in which plural pairs of the active component and the active region as well as the contact layer which configures the heat absorption portion are provided in the same semiconductor well region.

As shown in FIG. 6, two N-type MOS transistors NMOS each having the gate 21 and the N-type source/drain region 22 are formed in the same P-type semiconductor well region 3 as active components. The two N-type MOS transistors NMOS are arranged at a left part and a right part of the P-type semiconductor well region so as to be apart from each other.

The second contact layer 12 connected to the N+ active region 5 is formed so as to surround right and left as well as the back of each N-type MOS transistor NMOS. The N-type gate dummy 7N is formed at a left-near part of each N-type MOS transistor NMOS and the P-type gate dummy 7P is formed at a right-near part thereof.

The first-layer metal wiring layer 13 is connected to the P-type gate dummy 7P at the right-near part of the left MOS transistor NMOS and the N-type gate dummy 7N at the left-near part of the right MOS transistor NMOS through the first contact layer 11.

The N-type gate dummy 7N at the left-near part of the left MOS transistor NMOS and the P-type gate dummy 7P at the right-near part of the right MOS transistor NMOS are connected to gate dummies in not-shown adjacent semiconductor well regions in the same manner.

The plug layer 14 is formed over the center of the first-layer metal wiring layer 13 and the metal wiring layer 15 is formed thereon. The dummy pad 17 is formed further thereon.

Other structures are the same as the second embodiment shown in FIG. 5, therefore, repeated explanation is omitted.

The P-type semiconductor well region 3 and the N-type MOS transistors NMOS are shown in FIG. 6, however, it is also preferable to form plural pairs of the P-type MOS transistor PMOS and the active regions 6 as well as the second contact layer 12 also in the N-type semiconductor well region.

4. Fourth Embodiment

Figure 7:
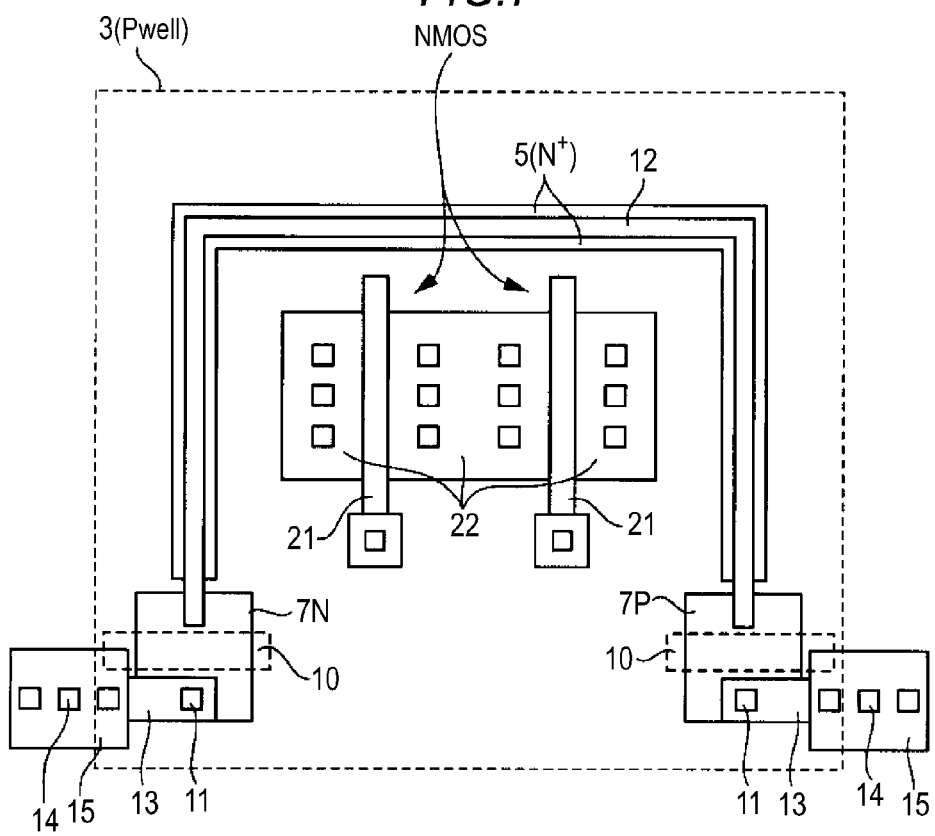
FIG. 7 is a schematic plan view of a semiconductor device according to a fourth embodiment of the invention.

A schematic plan view of a semiconductor device according to a fourth embodiment of the invention is shown in FIG. 7.

The embodiment relates to a case in which one heat absorption portion is provided with respect to plural number of active components.

As shown in FIG. 7, two N-type MOS transistors NMOS each having the gate 21 and the N-type source/drain region 22 are formed as active components in the P-type semiconductor well region 3. The two N-type MOS transistors NMOS use one of the source/drain region 22 in common between them.

Other structures are the same as the second embodiment shown in FIG. 5, therefore, repeated explanation is omitted.

The P-type semiconductor well region 3 and the N-type MOS transistor NMOS are shown in FIG. 7, however, it is also preferable that a pair of the active region 6 and the second contact layer 12 is arranged with respect to plural number of P-type MOS transistors PMOS also in the N-type semiconductor well region.

In the fourth embodiment, one common cooling function component is formed with respect to two N-type MOS transistors NMOS, therefore, the entire area can be reduced as compared with the third embodiment shown in FIG. 6.

In the plan views shown in FIG. 5 to FIG. 7, the minimum unit of the cooling function component is shown.

In the embodiment, the arrangement between the active component and the cooling function component is not limited to the arrangements shown in FIG. 5 to FIG. 7, and other arrangements may be applied.

For example, it is also preferable to apply an arrangement in which plural number of cooling function components is connected in series regardless of on which semiconductor well region of the P-type and N-type they are arranged.

It is not always necessary that the cooling function component is formed so as to be spread over the substrate surface of the semiconductor chip. It is sufficient that one or more cooling function components exist in the semiconductor chip or in the circuit block in the semiconductor chip.

5. Modification Example

Figure 8A:
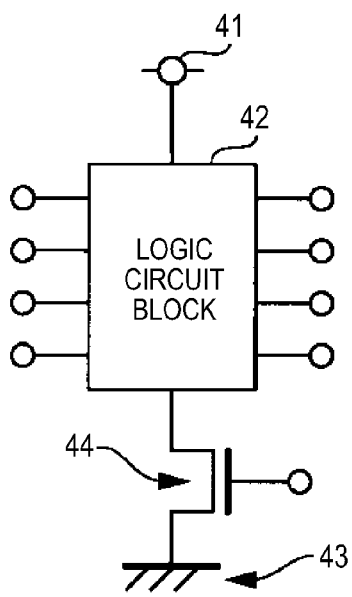
FIGS. 8A and 8B are circuit configuration diagrams of a semiconductor device in which a power gate is provided.
Figure 8B:
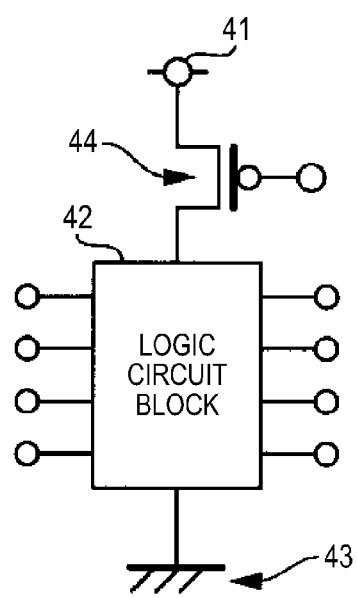

In the semiconductor chip of recent years, a mechanism called a power gate is provided, which suppresses power consumption by dynamically controlling a power source or a ground potential of the circuit block as shown by circuit configuration diagrams in FIGS. 8A and 8B.

In FIG. 8A, a power source 41 is connected to a logic circuit block 42, and a power gate 44 is connected between the logic circuit block 42 and a ground potential 43. In FIG. 8B, the ground potential 43 is connected to the logic circuit block 42, and the power gate 44 is connected between the logic circuit block 42 and the power source 41.

In the semiconductor device according to the embodiments of the invention, the power gate is further connected to the cooling function component, thereby suppressing power consumption necessary for cooling the chip.

A configuration example of the above case will be shown as follows.

Figure 9A:
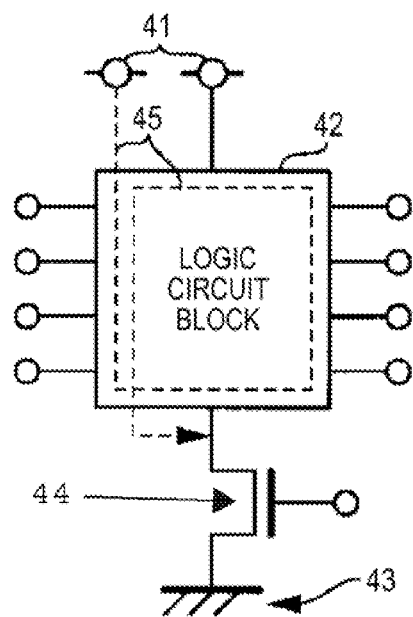
FIGS. 9A and 9B are circuit configuration diagrams in the case of providing the power gate to the semiconductor device according to an embodiment of the invention.

An example of a circuit configuration diagram in the case of providing the power gate in the semiconductor device according to the embodiments of the invention is shown in FIG. 9A. The example shown in FIG. 9A applies the configuration of the embodiments of the invention to the configuration in which the power gate 44 is connected on the side of the ground potential 43 of the logic circuit block 42 shown in FIG. 8A.

In FIG. 9A, the power source 41 is used in common between the logic circuit block 42 in which the power gate 44 is connected on the side of the ground potential 43 and the circuit of the cooling function component 45 according to the embodiment of the invention. One end of the cooling function component 45 is connected to the power source 41 and the other end of the cooling function component 45 is connected to the power gate 44. Accordingly, the power source of the cooling function component 45 is controlled in conjunction with dynamic control of power source supply in the logic circuit block 42.

Figure 9B:
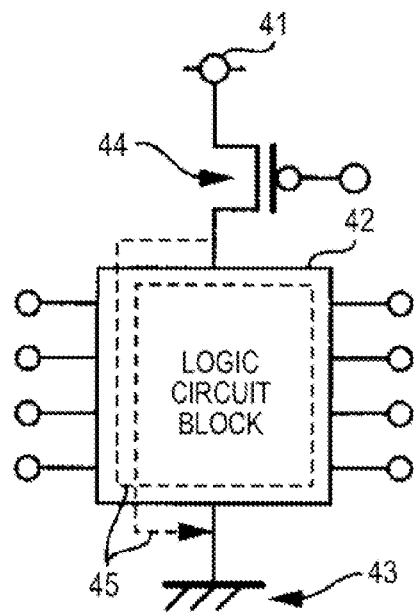

Another example of the circuit configuration diagram in the case of providing the power gate in the semiconductor device according to the embodiments of the invention is shown in FIG. 9B. The example shown in FIG. 9B applies the configuration of the embodiments of the invention to the configuration in which the power gate 44 is connected on the side of the power source 41 of the logic circuit block 42 shown in FIG. 8B.

In FIG. 9B, the ground potential 43 is used in common between the logic circuit block 42 and the circuit of the cooling function component 45 of the embodiment of the invention. One end of the cooling function component 45 is connected to the power gate 44 and the other end of the cooling function component 45 is connected to the ground potential 43. Accordingly, the ground potential of the cooling function component 45 is controlled in conjunction with ground potential control of the logic circuit block 42.

In the above-described respective embodiment, the component isolation layer 2 and the active regions 5, 6 are formed on the silicon substrate 1.

The semiconductor layer in which the active regions and the source/drain region of the transistor are formed is not limited to the silicon substrate in embodiments of the invention.

For example, a semiconductor substrate using a silicon epitaxial layer on the silicon substrate or other semiconductors, and a semiconductor epitaxial layer may be used.

Additionally, for example, a semiconductor layer on an insulating substrate may be used.

In the above-described respective embodiments, the configuration in which MOS transistors (NMOS, PMOS) are formed as active components at portions other than the portion where the cooling function component is formed in the silicon substrate 1.

The invention may also apply a configuration in which active components other than the configuration of the cooling function component and the MOS transistor (a diode, a bipolar transistor and the like) are formed on the semiconductor substrate.

The invention may further apply a configuration in which only passive components are formed on the semiconductor substrate without an active component. Also according to the configuration, the semiconductor substrate can be efficiently cooled by the cooling function component.

A position where the gate dummies 7N, 7P as the cooling function component are formed is not limited to the position over the component isolation layer 2 of the STI structure according to the above-described respective embodiments. For example, it is also possible that the gate dummies are formed over the semiconductor layer such as the silicon substrate through the gate insulating film or through insulating films other than the component isolation layer.

The component isolation layer of the STI structure is not limited to the structure of being completely buried in the semiconductor layer such as the silicon substrate, and part of the component isolation layer may be formed at a position upper than the surface of the semiconductor layer such as the silicon substrate. When the component isolation layer 2 of the STI structure is formed so as to be completely buried in the silicon substrate 1 and so on as in the above respective embodiments, the semiconductor layer with the gate dummies can be formed over the almost flat surface, therefore, the semiconductor layer can be easily formed with good film quality.

In the above respective embodiments, the gate dummies 7N, 7P having a different configuration from a gate of the MOS transistor and not operating as gates are used as the cooling function components.

In the embodiment, for example, it is possible to fabricate an N-type gate and a P-type gate having the same configuration as the gate of the MOS transistor and to use the gates as the cooling function component, not limited to the gate dummies.

The invention is not limited to the above embodiments and can apply other various configurations within a scope not departing from the gist thereof.

The present application contains subject matter related to that disclosed in Japanese Priority Patent Application JP 2010-004991 filed in the Japan Patent Office on Jan. 13, 2010, the entire contents of which is hereby incorporated by reference.

What is claimed is:

1. A semiconductor device comprising a cooling function component including:
   an active region made of an impurity region and formed on a surface of a semiconductor layer;
   an N-type gate made of a semiconductor including an N-type impurity;
   a P-type gate made of a semiconductor including a P-type impurity;
   a first metal wiring connected to the N-type gate, the P-type gate and the active region;
   a second metal wiring connected to the P-type gate and the N-type gate;
   a heat releasing portion connected to the second metal wiring for releasing heat to the outside;
   a silicide block made of an insulator, the silicide block being formed respectively at a part of each of surfaces of the N-type gate and the P-type gate; and
   a silicide made of a metal element and silicon, the silicide being formed on two portions of each of the surfaces of the N-type gate and the P-type gate, the two portions of each respective surface being separated by the silicide block, the silicide being also formed on a surface of the active region,
   wherein,
      the semiconductor layer, the N-type gate, and the P-type gate are made of silicon,
      the first metal wiring is connected to the silicide at one of the two portions as well as at the surface of the active region, and
      the second metal wiring is connected to the silicide at the other of the two portions.

2. The semiconductor device according to claim 1, wherein the heat releasing portion is thermally connected to the second metal wiring and includes a metal layer.

3. The semiconductor device according to claim 2, wherein the heat releasing portion includes a heatsink that is thermally connected to the metal layer.

4. The semiconductor device according to claim 1, wherein a plural number of the N-type gates and the P-type gates are electrically connected in an alternating arrangement.

5. The semiconductor device according to claim 1, wherein an active component is formed on the semiconductor layer on which the cooling function component is formed.

6. The semiconductor device according to claim 5, further comprising:
   another impurity region formed in the semiconductor layer, the active component including the another impurity region,
   a contact layer electrically connected to the another impurity region,
   and the first metal wiring and the second metal wiring are made of the same metal layer as the contact layer.

7. The semiconductor device according to claim 5, wherein:

the semiconductor layer includes a semiconductor well region, and the active component and the active region of the cooling function component are both formed in the semiconductor well region in the semiconductor layer.

8. The semiconductor device according to claim 1, wherein:

a power source or a ground potential of a circuit block and a power source or a ground potential of the cooling function component are connected in common, and a control circuit dynamically controls the power source or the ground potential connected in common.

9. The semiconductor device according to claim 1, wherein the N-type gate and the P-type gate are respectively formed on a component isolation layer formed in the semiconductor layer.

* * * * *